US006534239B2

(12) United States Patent
Varanasi et al.

(10) Patent No.: US 6,534,239 B2
(45) Date of Patent: Mar. 18, 2003

(54) RESIST COMPOSITIONS WITH POLYMERS HAVING PENDANT GROUPS CONTAINING PLURAL ACID LABILE MOIETIES

(75) Inventors: Pushkara Rao Varanasi, Poughkeepsie, NY (US); Margaret C. Lawson, La Grangeville, NY (US); Wenjie Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 09/844,848

(22) Filed: Apr. 27, 2001

(65) Prior Publication Data

US 2002/0182534 A1 Dec. 5, 2002

(51) Int. Cl.$^7$ ................................................ G03F 7/004
(52) U.S. Cl. .................... 430/270.1; 430/326; 430/905; 430/323
(58) Field of Search .............................. 430/270.1, 326, 430/905, 323

(56) References Cited

U.S. PATENT DOCUMENTS

| | | | |
|---|---|---|---|
| 4,855,017 A | 8/1989 | Douglas | |
| 5,362,663 A | 11/1994 | Bronner | |
| 5,468,819 A | 11/1995 | Goodall | |
| 5,562,801 A | 10/1996 | Nulty | |
| 5,618,751 A | 4/1997 | Golden | |
| 5,705,503 A | 1/1998 | Goodall | |
| 5,744,376 A | 4/1998 | Chan | |
| 5,801,094 A | 9/1998 | Yew | |
| 5,821,169 A | 10/1998 | Nguyen | |
| 5,843,624 A | 12/1998 | Houlihan | |
| 6,048,664 A | 4/2000 | Houlihan | |
| 6,054,248 A * | 4/2000 | Foster et al. ............. | 430/271.1 |
| 6,106,993 A | 8/2000 | Watanabe et al. ......... | 430/270.1 |
| 6,117,621 A | 9/2000 | Hatakeyama et al. ....... | 430/326 |
| 6,124,074 A | 9/2000 | Varanasi | |
| 6,140,015 A | 10/2000 | Varanasi | |
| 6,146,793 A * | 11/2000 | Schaedeli et al. ............ | 430/18 |
| 6,177,228 B1 | 1/2001 | Allen | |
| 6,368,771 B1 * | 4/2002 | Koh et al. ................ | 430/270.1 |
| 6,391,518 B1 * | 5/2002 | Jung et al. ................ | 430/270.1 |
| 6,403,281 B1 * | 6/2002 | Lee et al. ................ | 430/270.1 |

* cited by examiner

Primary Examiner—Rosemary Ashton
(74) Attorney, Agent, or Firm—Steven Capella

(57) ABSTRACT

Acid-catalyzed positive resist compositions which are imageable with 193 nm radiation and/or possibly other radiation and are developable to form resist structures of improved development characteristics and improved etch resistance are enabled by the use of resist compositions containing imaging polymer having a monomer with a pendant group containing plural acid labile moieties. Preferred pendant groups containing plural acid labile moieties are characterized by the presence of a bulky end group.

23 Claims, No Drawings

RESIST COMPOSITIONS WITH POLYMERS HAVING PENDANT GROUPS CONTAINING PLURAL ACID LABILE MOIETIES

CROSS REFERENCE TO RELATED APPLICATIONS

Related applications are: U.S. patent application Ser. No. 09/266,342, filed Mar. 11, 1999, titled "Photoresist Compositions with Cyclic Olefin Polymers and Additive"; U.S. patent application Ser. No. 09/266,343, filed Mar. 11, 1999, now abandoned, titled "Photoresist Compositions with Cyclic Olefin Polymers and Hydrophobic Non-Steroidal Alicyclic Additives"; U.S. patent application Ser. No. 09/266,341, filed Mar. 11, 1999, now U.S. Pat. No. 6,124,074, titled "Photoresist Compositions with Cyclic Olefin Polymers and Hydrophobic Non-Steroidal Multi-Alicyclic Additives"; and U.S. patent application Ser. No. 09/266,344, filed Mar. 11, 1999, now abandoned titled "Photoresist Compositions with Cyclic Olefin Polymers and Saturated Steroid Additives". Additional related applications are: U.S. patent application Ser. No. 09/566,395, filed May 5, 2000, now U.S. Pat. No. 6,251,560, titled "Photoresist Compositions with Cyclic Olefin Polymers Having Lactone Moiety"; U.S. patent application Ser. No. 09/566,397, filed May 5, 2000, now abandoned titled "Copolymer Photoresist with Improved Etch Resistance"; U.S. patent application Ser. No. 09/639,784, filed Aug. 16, 2000, now U.S. Pat. No. 6,391,521, titled "Resist Compositions Containing Bulky Anhydride Additives"; and U.S. patent application Ser. No.09/639,784, filed Aug. 16, 2000, now U.S. Pat. No. 6,391,521 titled "Resist Compositions Containing Lactone Additives." The disclosures of the above applications are incorporated herein by reference.

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the trend has been to move from so-called I-line radiation (350 nm) to 248 nm radiation. For future reductions in size, the need to use 193 nm radiation appears likely. Unfortunately, photoresist compositions at the heart of current 248 nm lithographic processes are typically unsuitable for use at shorter wavelengths.

While a resist composition must possess desirable optical characteristics to enable image resolution at a desired radiation wavelength, the resist composition must also possess suitable chemical and mechanical properties to enable transfer to the image from the patterned resist to an underlying substrate layer(s). Thus, a patternwise exposed positive resist must be capable of appropriate dissolution response (i.e. selective dissolution of exposed areas) to yield the desired resist structure. Given the extensive experience in the lithographic arts with the use of aqueous alkaline developers, it is important to achieve appropriate dissolution behavior in such commonly used developer solutions.

The patterned resist structure (after development) must be sufficiently resistant to enable transfer of the pattern to the underlying layer(s). Typically, pattern transfer is performed by some form of wet chemical etching or ion etching. The ability of the patterned resist layer to withstand the pattern transfer etch process (i.e., the etch resistance of the resist layer) is an important characteristic of the resist composition.

While some resist compositions have been designed for use with 193 nm radiation, these compositions have generally failed to deliver the true resolution benefit of shorter wavelength imaging due to a lack of performance in one or more of the above mentioned areas. The resist compositions disclosed in the above-referenced applications represent advancement over the prior art in that the resists are capable of delivering the lithographic performance associated with 193 nm lithography, however there remains a desire for improved resist compositions useful in 193 nm lithography. For example, there is a desire for resist compositions exhibiting improved development characteristics (e.g., resolution, development speed, contrast, shrinkage, etc.), improved etch resistance, and improved lithographic process window. There is especially a desire for resist compositions having improved shrinkage characteristics.

SUMMARY OF THE INVENTION

The invention provides resist compositions which are capable of high resolution lithographic performance with (a) reduced shrinkage upon exposure and/or post-exposure bake, (b) improved dissolution characteristics, and/or (c) improved formulation/applied film homogeneity. The resists of the invention are preferably imageable using 193 nm imaging radiation (and possibly also with other imaging radiation).

The invention also provides lithographic methods using the resist compositions of the invention to create resist structures and methods using the resist structures to transfer patterns to an underlying layer(s). The lithographic methods of the invention are preferably characterized by the use of 193 nm ultraviolet radiation patternwise exposure. The methods of the invention are preferably capable of resolving features of less than about 150 nm in size, more preferably less than about 130 nm in size without the use of a phase shift mask.

In one aspect, the invention encompasses a resist composition comprising: (a) an imaging polymer, and (b) a radiation-sensitive acid generator, the imaging polymer comprising monomer units having group pendant from the polymerizing portion of the monomer, the pendant group containing plural acid labile moieties (hereafter also referred to as "PALM" group). The PALM group may be pendant from cyclic olefin monomer units or from other desired monomer units forming the backbone of the imaging polymer. The PALM group preferably has a bulky end group such as an alicyclic group and/or a medium chain hydrocarbon (e.g., $C_6$–$C_{10}$). In the absence of generated acid, the PALM group preferably inhibits solubility of the resist in aqueous alkaline solutions.

Preferably, the imaging polymer contains (i) cyclic olefin monomeric units in the polymer backbone (i.e., the polymerizable portion of monomeric units making up the polymer), and/or (ii) alicyclic moieties as bulky end groups on the end of the PALM group. In the absence of generated acid, the imaging polymer is preferably substantially insoluble in aqueous alkaline solutions such that the resist is a positive resist.

In another aspect, the invention encompasses the PALM-containing monomers and the imaging polymers containing the PALM-containing monomers.

In another aspect, the invention encompasses a method of creating a patterned resist structure on a substrate, the method comprising:

(a) providing a substrate having a surface layer of the resist composition of the invention, (b) patternwise exposing the resist layer to imaging radiation whereby portions of the resist layer are exposed to radiation, and (c) contacting the resist layer with an aqueous alkaline developer solution to remove the exposed portions of the resist layer to create the patterned resist structure.

Preferably, the radiation used in step (b) in the above method is 193 nm ultraviolet radiation. The invention also encompasses processes for making conductive, semiconductive, magnetic or insulative structures using the patterned resist structures containing the compositions of the invention.

These and other aspects of the invention are discussed in further detail below.

DETAILED DESCRIPTION OF THE INVENTION

The resist compositions of the invention are generally characterized by the presence of an imaging polymer which contains monomer units having a pendant PALM group. These compositions are preferably capable of providing high resolution lithographic patterns using 193 nm radiation with (a) reduced shrinkage upon exposure and/or post-exposure bake, (b) improved dissolution characteristics, and/or (c) improved formulation/applied film homogeneity. The invention further encompasses patterned resist structures containing the resist compositions of the invention, as well as processes for creating the resist structures and using the resist structures to form conductive, semiconductive and/or insulative structures. The invention also encompasses polymerizable monomers having a pendant PALM group.

The resist compositions of the invention generally comprise (a) an imaging polymer, and (b) a radiation-sensitive acid generator, the imaging polymer comprising monomer units having a pendant PALM group. Preferred monomeric units containing the PALM group may be represented by the structure:

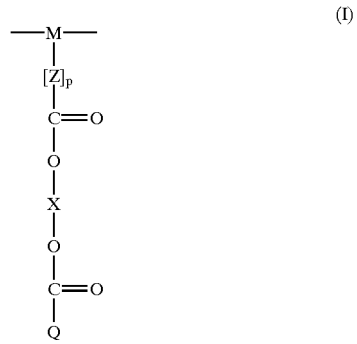

(I)

wherein:

(i) X is a component that forms at least one acid-labile bond with an oxygen of each neighboring carboxyl moiety and/or itself contains plural acid labile moieties, (ii) M is a preferably polymerizing backbone moiety independently selected from the group consisting of an ethylenic moiety and a cyclic olefin moiety, or other suitably polymerizable moiety, (iii) Z is a moiety independently selected from the group consisting of cycloalkyl, linear alkyl ($C_1$–$C_3$), or other compatible spacer moiety, (iv) p is independently equal to 0 or 1, and (v) Q is a bulky end group.

The imaging polymer may contain other monomeric units as described below which may affect the choice of backbone unit M on the basis of ease of polymerization. For example, if the polymer only contains other monomeric units which have cyclic olefin polymerizing moieties, then M is preferably selected from (a) an ethylenic moiety having a pendant trifluoromethyl moiety (where p is zero, M would preferably form part of a trifluoromethacrylate) and (b) other cyclic olefin monomeric units. If the imaging polymer does not contain monomeric units containing cyclic olefin polymerizing moieties or if the imaging polymer further contains non-cyclic olefin monomeric units capable of undergoing free-radical copolymerization with cyclic olefin monomers (such as those described in U.S. patent application Ser. No. 09/566,397, abandoned, referenced above), then M is preferably selected from (a) an ethylenic moiety having (i) a pendant trifluoromethyl moiety (where p is zero, M would preferably form part of a trifluoromethacrylate), (ii) a pendant methyl moiety (where p is zero, M would preferably form part of a methacrylate, or (iii) no pendant moiety (other than the PALM group—where p is zero, M would preferably form part of an acrylate) and (b) other cyclic olefin monomeric units.

The other consideration regarding the selection of M relates to the preference that the imaging polymer contain (i) cyclic olefin monomeric units in the polymer backbone (i.e., the polymerizable portion of monomeric units making up the polymer), and/or (ii) alicyclic moieties as bulky end groups on the end of the PALM group. Thus, if there were no other monomeric units in the polymer which contained cyclic olefin polymerizing moieties and end group Q did not contain an alicyclic moiety, then M would preferably be a cyclic olefin. Otherwise, the imaging polymer of the invention is generally open to M being selected from any suitably polymerizable moiety which is compatible with the other monomers in the imaging polymer and the intended end use of the composition as a resist.

Examples of some possible M moiety structures (II) are illustrated below:

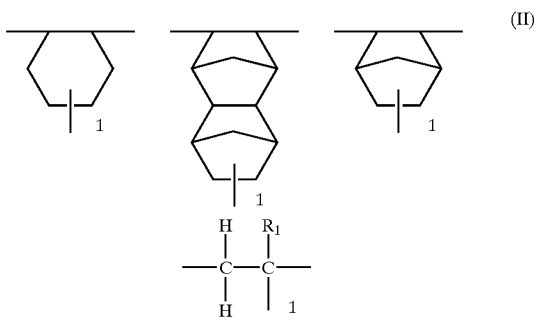

(II)

where position 1 represents a bond to Z or a direct bond to a carboxyl moiety and $R_1$ is preferably selected from H, $CH_3$ or $CF_3$.

Component X may vary in structure as long as (a) the O-X bonds remain acid labile such that the bonds can be broken upon exposure to the acid generated by the radiation-sensitive acid generator upon radiation exposure, and/or (b)

X itself contains acid labile bonds (apart from the bonds to the oxygen of the carboxyl moieties). Preferably, X is such that each O-X bond represents at least one an acid labile moiety selected from the group consisting of tertiary alkyloxy (more preferably butyloxy), ketal, and acetal. The acid labile moieties are preferably reactive with acid such that further acid is generated and the remaining component on the imaging polymer chain and the portion remaining with the bulky group Q both promote alkaline solubility of the radiation-exposed portions of the resist. If desired, X may be such that the acid labile moieties are different at different X-O locations in the PALM group. Most preferably, X is such that O-X-O represents two acid labile ester groups which are bonded together. In general, X is preferably selected such that any reaction byproduct molecules, other than molecules containing Q, are low in molecular weight or volume such that the exposed resist doesn't shrink too much during exposure or post-exposure bake.

While component X is shown with two bonds, it is possible for component X to have a greater number of acid labile (or other) bonds (e.g., where X is a tri-functional hexane ring). Another alternative X structure could contain a core moiety (e.g., a ring structure) with one or more pendant tertiary alkyl moieties whereby the acid labile O-X bond is between the oxygen of the carboxyl moiety and the tertiary alkyl moiety of component X. Where the resist is going to be used with 193 nm imaging radiation, preferably component X does not introduce any unsaturated carbon bonds to the resist.

The end group Q is preferably a bulky group. More preferably, Q contains one or more bulky constituents such as saturated alicyclic structures. Q preferably is free of unsaturated carbon-carbon bonds. Preferred alicyclic structures are selected from the group consisting of norbornyl, adamantyl and saturated fused polycyclic hydrocarbons (more preferably bicyclic). Alternatively, the bulky constituent may be an acyclic saturated hydrocarbon (linear or branched), preferably containing at least 10 carbon atoms.

The imaging polymer may be a homopolymer of the PALM-containing monomer described above or may contain other monomeric units in addition to the PALM-containing monomer. For example, the imaging polymer may contain one or more of the following: (a) cyclic olefin monomers containing acid labile moieties (other than a PALM group) which inhibit the solubility of the resist in aqueous alkaline solutions, (b) cyclic olefin monomeric units having polar moieties which promote solubility in aqueous alkaline solutions, (c) cyclic olefin monomeric units having pendant lactone moieties such as those described in U.S. patent application Ser. No. 09/566,395, U.S. Pat. No. 6,251,560, referenced above, (d) other cyclic olefin monomeric units not falling under (a)–(c), e.g., monomeric units having no pendant moieties, pendant moieties which are non-polar and non-acid labile, etc., (e) non-cyclic olefin monomeric units capable of undergoing free-radical copolymerization with the PALM-containing monomer, such as those described in U.S. patent application Ser. No. 09/566,397 referenced above, (f) non-cyclic olefin monomeric units capable of undergoing addition polymerization with the PALM-containing monomers (e.g., acrylate monomers), and/or (g) other monomeric units that are compatible with the function of the polymer as component of the resist.

As noted above, the selection of M of the PALM-containing monomer and the selection of any other monomers to be contained in the imaging polymer is preferably such that the imaging polymer contains cyclic olefin backbone units and/or alicyclic moieties in at least some pendant groups.

Cyclic olefin units (a) may be any cyclic olefin monomeric unit having an acid labile moiety that inhibit solubility in aqueous alkaline solutions. Examples of cyclic olefin monomers include the following monomers illustrated by structure (III) below where $R_2$ represents an acid-labile protecting moiety and n is zero or some positive integer (preferably n is 0 or 1):

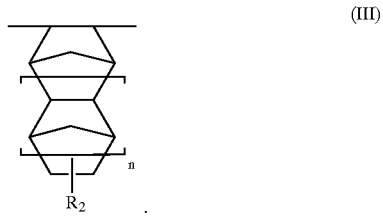

(III)

More preferably, the cyclic olefin units (a) are selected from:

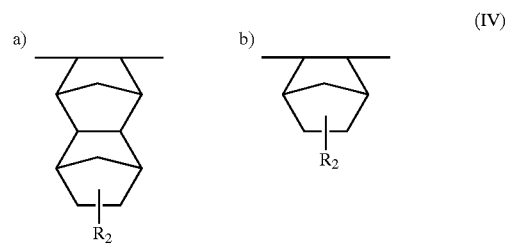

(IV)

where $R_2$ represents an acid-labile protecting moiety. Preferred acid-labile protecting moieties are selected are selected from the group consisting of tertiary alkyl (or cycloalkyl) carboxyl esters (e.g., t-butyl, methyl cyclopentyl, methyl cyclohexyl, methyl adamantyl), ester ketals, and ester acetals. Tertiary butyl carboxyl ester and methyl cyclohexyl are a most preferred acid-labile protecting moieties. If desired, combinations of cyclic olefin units (a) having differing protecting functional groups may be used.

Cyclic olefin units (b) may be any cyclic olefin monomeric unit having a polar functional group that promotes alkaline solubility. Examples of cyclic olefin monomers include the following monomers illustrated by structure (V) below where $R_3$ represents an acidic polar moiety and n is zero or some positive integer (preferably n is 0 or 1):

(V)

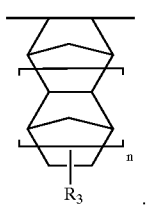

More preferably, the cyclic olefin units (b) are selected from:

(VI)

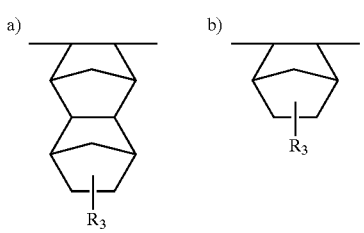

where $R_3$ represents a polar moiety (preferably an acidic polar moiety) which promotes solubility in aqueous alkaline solutions. The acidic polar moieties preferably have a $pK_a$ of about 13 or less. Preferred acidic polar moieties contain polar groups selected from the group consisting of carboxyl, sulfonamidyl, fluoroalcohol, and other acidic polar groups. Preferred acidic polar moieties are carboxyl groups. If desired, combinations of cyclic olefin units (b) having differing acidic polar functional groups may be used.

Cyclic olefin monomeric units (d) preferably have the structure:

(VII)

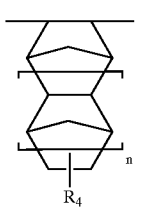

where n is zero or an integer and $R_4$ is selected from the group consisting of hydrogen, $C_1$–$C_6$ alkyl, and sulfonamidyl groups. More preferably, monomeric unit (d) is selected from:

(VIII)

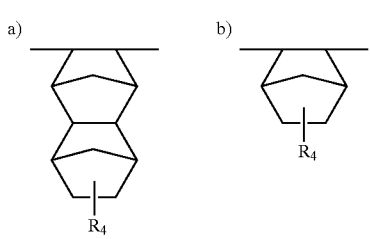

where $R_4$ is selected from the group consisting of hydrogen, and $C_1$–$C_6$ alkyl groups. If desired, a combination of cyclic olefin monomeric units (d) may be used. Preferred cyclic olefin monomeric units (d) have $R_4$ as a $C_3$–$C_5$ alkyl, more preferably a $C_4$ alkyl.

In general, for lithographic applications used in the manufacture of integrated circuit structures and other microscopic structures, the imaging polymers of invention preferably comprise at least about 10 mole % of PALM-containing monomeric units, more preferably about 10–50 mole %, most preferably about 20–40 mole %. Otherwise, the amount of other constituents in the imaging polymer preferably are those found in polymers for resist formulations used with 193 nm imaging radiation (i.e., the PALM-containing monomeric units being used instead of at least a portion of the acid-labile moiety-containing monomeric units in those polymers). Thus, for example, in the polymers described in U.S. Pat. Nos. 5,843,624; 6,124,074; and 6,177,228, the disclosures of which are incorporated herein by reference, and U.S. patent applications Ser. No. 09/566,395 and 09/566,397 (referenced above), the specified monomeric units containing acid-labile moieties could be replaced at least in part with PALM-containing monomeric units. It should be understood that the invention is not limited to the use of PALM-containing monomeric units in any specific polymer or specific resist formulation.

In addition to the imaging polymers, the resist compositions of the invention contain a radiation-sensitive (photosensitive) acid generator. The invention is not limited to the use of any specific acid generator or combination of acid generators, that is the benefits of the invention may be achieved using various acid generators known in the art. Preferred acid generators are those which contain reduced amounts (or preferably zero) aryl moieties. Where aryl-containing acid generator is employed, the absorptive characteristics of the acid generator at 193 nm may restrict the amount of acid generator that can be included in the formulation.

Examples of suitable acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α–α' bis-sulfonyl diazomethanes, naphthoquinone4-diazides, alkyl disulfones and others.

The resist compositions of the invention preferably further contain a bulky, hydrophobic additive ("BH" additives) which is substantially transparent to 193 nm radiation. The BH additives have generally enable and/or enhance the ability to resolve ultrafine lithographic features in response to conventional aqueous alkaline developers. The BH additives are preferably characterized by the presence of at least one alicyclic moiety. Preferably, the BH additive contains at least about 10 carbon atoms, more preferably at least 14 carbon atoms, most preferably about 14 to 60 carbon atoms. The BH additive preferably contains one or more additional moieties such as acid-labile pendant groups which undergo cleaving in the presence of acid to provide a constituent which acts to promote alkaline solubility of the radiation-exposed portions of the resist. Preferred BH additives are selected from the group consisting of saturated steroid compounds, non-steroidal alicyclic compounds, and non-steroidal multi-alicyclic compounds having plural acid-labile connecting groups between at least two alicyclic moieties. More preferred BH additives include lithocholates such as t-butyl-3-trifluoroacetyllithocholate, t-butyl adamantane carboxylate, and bis-adamantyl t-butyl carboxylate. Bis-adamantyl t-butyl carboxylate is a most preferred BH additive. If desired, a combination of BH additives can be used.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate, cyclohexanone, and ethyl cellosolve acetate.

The compositions of the invention may further contain minor amounts of auxiliary components such as dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines or t-alkyl ammonium hydroxides such as t-butyl ammonium hydroxide (TBAH).

The resist compositions of the invention preferably contain about 0.5–20 wt. % (more preferably about 3–15 wt. %) acid generator based on the total weight of imaging polymer in the composition. Where a solvent is present, the overall composition preferably contains about 50–90 wt. % solvent. The composition preferably contains about 1 wt. % or less of said base additive based on the total weight of imaging polymer. The resist compositions of the invention preferably contain at least about 5 wt. % of the BH additive component based on the total weight of imaging polymer in the composition, more preferably about 10–25 wt. %, most preferably about 10–20 wt. %.

The PALM-containing monomers and other monomers used in the present invention may be synthesized by known techniques. For example, where M is an ethylenic moiety, a PALM-containing monomer structure (IX) below can be synthesized by synthesis route described in Example 1 below.

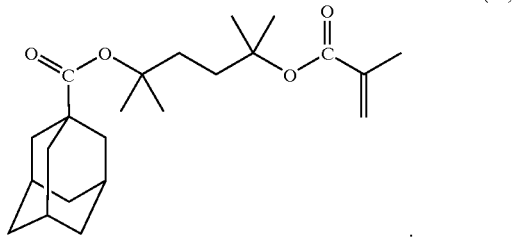

(IX)

Where the PALM-containing polymer has an ethylenic backbone, an example of a polymerization processes using free radical polymerization are illustrated in Example 2 below.

The invention is not limited to any specific method of synthesizing the imaging polymers used in the invention. Preferably, the imaging polymers are formed by addition polymerization or free radical polymerization. Examples of other suitable techniques for cyclic olefin polymers and other polymers are disclosed in U.S. Pat. Nos. 5,468,819, 5,705,503, 5,843,624 and 6,048,664, the disclosures of which are incorporated herein by reference. The imaging polymers of the invention preferably have a weight average molecular weight of about 5,000–100,000, more preferably about 10,000–50,000. While the invention has been described in terms of a PALM-containing monomer, it should be understood that invention also encompasses imaging polymers where the PALM group is formed on the polymer after polymerization.

The resist compositions of the invention can be prepared by combining the imaging polymer, acid generator, optional BH additive and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 100–175° C., more preferably about 125–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art. The compositions of the invention enable the reproduction of lithographic features The pattern from the resist structure may then be transferred to the material (e.g., ceramic, metal or semiconductor) of the underlying substrate. Typically, the transfer is achieved by reactive ion etching or some other etching technique. In the context of reactive ion etching, the etch resistance of the resist layer is especially important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (ceramic, metal or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Synthesis of PALM-methacrylate Monomer (IX)

To a solution containing 43.4 g (0.297 mol) of 2,5-dimethyl-2,5-hexanediol in 600 ml of methylene chloride, 30.0 g (0.297 mol) of triethylamine was added at room temperature. The solution was cooled to ~10° C. 65.0 g (0.327 mol) of 1-adamantane carbonyl chloride in 250 ml of methylene chloride was added to the solution via a funnel over the course of 5 hours. After the addition was complete, the reaction mixture was stirred under refluxing condition for 17 hours. The reaction mixture was filtered to remove triethylamine hydrochloride formed during the reaction. The filtrate was washed with water (x400 ml) three times, dried over anhydrous magnesium sulfate, and then concentrated under reduced pressure. The concentrated filtrate was passed through a chromatography column (silica gel; hexane/methylene chloride: 1/1) resulting in 63.9 g of product which was identified by NMR spectroscopy as 2-(1-adamantane carboxyloxy)-2,5-dimethyl-5-hexanol. 23.8 g (0.228) of distilled methacryloyl chloride in 500 ml methylene chloride was added dropwise via a funnel to a solution of 63.9 g (0.207 mol) of the 2-(1-adamantane carboxyloxy)-2,5-dimethyl-5-hexanol (from above) and 23.1 g (0.228 mol) of triethylamine in 500 ml methylene chloride. After the addition was complete, the reaction mixture was stirred at room temperature for 15 hours and subsequently under refluxing condition for 24 hours. The reaction mixture was filtered to remove triethylamine hydrochloride formed during the reaction. The filtrate was washed with water (×400 ml) three times, dried over anhydrous magnesium sulfate, and then concentrated under reduced pressure. The concentrated filtrate was passed through a column chromatography (silica gel; hexane/ethyl acetate: 85/15) three times resulting in 60 g of product which was identified as the PALM-methacrylate monomer (IX).

EXAMPLE 2

Polymer Synthesis 0.135g (0.000821 mol) of 2,2'-azobisisobutyronitrile (AIBN) was added to a solution of 5.7 g (0.0156 mol) of PALM methacrylate (PALM), 3.48 g (0.0156 mol) of isobornyl methacrylate (IBMA), and 4.0 g (0.0235 mol) a-methacryloyl butyrolactone (GBLMA) in 75.5 g THF. The reaction mixture was slowly brought to reflux under nitrogen atmosphere and was further stirred under the refluxing condition for 42 hours. After the completion of polymerization, the reaction mixture was cooled to room temperature, precipitated into methanol (1.2 L), stirred for one hour and filtered. The filtered (PALM-IBMA-GBLMA) polymer was dried under vacuum at 50° C. overnight.

EXAMPLE 3

Lithographic Evaluation

For the purpose of lithographic experiments, a resist formulation containing the PALM-IBMA-GBLMA copolymer was prepared by combining the materials set forth below, expressed in part by weight.

| | |
|---|---|
| Propylene glycol monomethyl ether acetate | 87.6 |
| PALM-IBMA-GBLMA copolymer | 12 |
| Di-t-butylphenyliodonium perfluorooctanesulfonate | 0.36 |
| perfluorpbutylsulfonyloxybicyclo [2.2.1]-hept-5-ene-2,3-dicarboximide | 0.06 |
| Tetrabutyl ammonium hydroxide | 0.024 |

The resist formulation was spin-coated (for 30 seconds) onto an antireflective material (AR19, Shipley Company) layer applied on silicon wafers. The resist layer was soft-baked at 130° C. for 60 seconds on a vacuum hot plate to produce a film of about 0.4 mm thickness. The wafers were then exposed to 193 nm radiation (Nikon stepper, 0.6 NA). The exposure pattern was an array of lines and spaces of varying dimensions down to 0.1 mm. The exposed wafers were post-exposure baked on a vacuum hot plate at 150° C. for 90 seconds. The wafers were then (puddle) developed using 0.263 N tetramethyl ammonium hydroxide developer. The patterns were examined by scanning electron microscopy (SEM). Line/space pairs of 150 nm and above were well resolved with clean profiles.

For shrinkage experiment, the resist formulation was spin-coated (for 30 seconds) onto an antireflective material (AR19, Shipley Company) layer applied on silicon wafers. The resist layer was soft-baked at 130° C. for 60 seconds on a vacuum hot plate to produce a film of about 0.4 mm thickness. The wafers were then exposed to 193 nm radiation (Nikon stepper, 0.6 NA) at different doses. The exposed wafers were post-exposure baked (PEB) on a vacuum hot plate at 150° C. for 90 seconds. Film thickness at different doses was measured using Nanospec. The film shrinkage was calculated as the difference in thickness before and after exposure. The film shrinkage experiment confirmed that the bulky deprotection product (1-adamantane carboxylic acid) remained in the resist film after PEB.

What is claimed is:

1. A resist composition comprising (a) an imaging polymer, and (b) a radiation sensitive acid generator, said imaging polymer comprising monomer units having a group pendant from a polymerizing portion of the monomer, the pendant group (PALM group) containing plural acid labile moieties, said PALM-containing monomeric units further comprising a bulky end group having at least 10 carbon atoms, said end group being selected from the group consisting of alicyclic moieties and acyclic saturated hydrocarbons.

2. The composition of claim 1 wherein said imaging polymer contains cyclic olefin monomeric units in a backbone portion of said polymer, and/or (ii) alicyclic moieties as bulky end groups on the end of said PALM group.

3. The composition of claim 1 wherein said PALM-containing monomeric units comprise a backbone moiety selected from the group consisting of cyclic olefin moieties and ethylenic moieties.

4. The composition of claim 3 wherein said PALM-containing monomeric units comprise a cyclic olefin backbone moiety.

5. The composition of claim 3 wherein said PALM-containing monomeric units comprise an ethylenic backbone moiety.

6. The composition of claim 5 wherein said PALM-containing monomeric units comprise a methyl or trifluoromethyl group pendant from said ethylenic backbone moiety, said methyl or trifluoromethyl group being separate from said PALM group.

7. The composition of claim 1 wherein said imaging polymer further comprises having at least one monomeric unit selected from the group consisting of (a) cyclic olefin monomeric units containing acid labile moieties other than a PALM group which inhibit the solubility of the resist in aqueous alkaline solutions, (b) cyclic olefin monomeric units containing polar moieties which promote solubility of said resist in aqueous alkaline solutions, (c) cyclic olefin monomeric units containing pendant lactone moieties, (d) cyclic olefin monomeric units containing no pendant moieties or pendant moieties which are non-polar and non-acid labile, (e) non-cyclic olefin monomeric units capable of undergoing free-radical copolymerization with said PALM-containing monomeric units, and (f) non-cyclic olefin monomeric units capable of undergoing addition polymerization with said PALM-containing monomeric units.

8. The composition of claim 7 wherein said imaging polymer comprises (a) cyclic olefin monomeric units containing acid labile moieties other than a PALM group which inhibit the solubility of the resist in aqueous alkaline solutions.

9. The composition of claim 7 wherein said imaging polymer comprises (b) cyclic olefin monomeric units containing polar moieties which promote solubility of said resist in aqueous alkaline solutions.

10. The composition of claim 7 wherein said imaging polymer comprises (c) cyclic olefin monomeric units containing pendant lactone moieties.

11. The composition of claim 7 wherein said imaging polymer comprises (e) non-cyclic olefin monomeric units capable of undergoing free-radical polymerization with said PALM-containing monomeric units.

12. The composition of claim 7 wherein said imaging polymer comprises (f) non-cyclic olefin monomeric units capable of undergoing addition polymerization with said PALM-containing monomeric units.

13. The composition of claim 1 wherein said resist composition contains at least about 0.5 wt. % of said radiation sensitive acid generator based on the weight of said imaging polymer.

14. The composition of claim 1 wherein said PALM-containing monomeric units have by the structure:

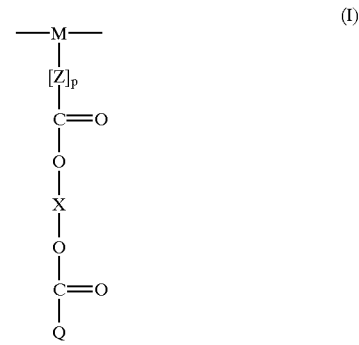

wherein:
(i) X is a component that forms at least one acid-labile bond with an oxygen of each neighboring carboxyl moiety and/or itself contains plural acid labile moieties,
(ii) M is polymerizing backbone moiety independently selected from the group consisting of an ethylenic moiety and a cyclic olefin moiety,
(iii) Z is a moiety selected from the group consisting of cycloalkyl and linear alkyl ($C_1$–$C_3$),
(iv) p is equal to 0 or 1, and
(v) Q is said bulky end group.

15. A method of forming a patterned material structure on a substrate, said material being selected from the group consisting of semiconductors, ceramics and metals, said method comprising:
(A) providing a substrate with a layer of said material,
(B) applying a resist composition to said substrate to form a resist layer on said substrate, said resist composition comprising (a) an imaging polymer, and (b) a radiation sensitive acid generator, said imaging polymer comprising monomer units having a group pendant from a polymerizing portion of the monomer, the pendant group (PALM group) containing plural acid labile moieties, said PALM-containing monomeric units further comprising a bulky end group having at least 10 carbon atoms, said end group being selected from the group consisting of alicyclic moieties and acyclic saturated hydrocarbons;
(C) patternwise exposing said substrate to radiation whereby acid is generated by said acid generator in exposed regions of said resist layer by said radiation, (D) contacting said substrate with an aqueous alkaline developer solution, whereby said exposed regions of said resist layer are selectively dissolved by said developer solution to reveal a patterned resist structure, and (E) transferring resist structure pattern to said material layer, by etching into said material layer through spaces in said resist structure pattern.

16. The method of claim 15 wherein said material is metal.

17. The method of claim 15 wherein said etching comprises reactive ion etching.

18. The method of claim 15 wherein at least one intermediate layer is provided between said material layer and said resist layer, and step (E) comprises etching through said intermediate layer.

19. The method of claim 15 wherein said radiation has a wavelength of about 193 nm.

20. The method of claim 15 wherein said substrate is baked between steps (C) and (D).

21. The method of claim 15 wherein said PALM-containing monomeric units have by the structure:

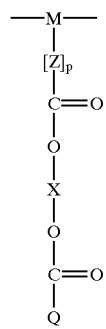
(I)

wherein:

(i) X is a component that forms at least one acid-labile bond with an oxygen of each neighboring carboxyl moiety and/or itself contains plural acid labile moieties, (ii) M is polymerizing backbone moiety independently selected from the group consisting of an ethylenic moiety and a cyclic olefin moiety, (iii) Z is a moiety selected from the group consisting of cycloalkyl and linear alkyl ($C_1$–$C_3$), (iv) p is equal to 0 or 1, and (v) Q is said bulky end group.

22. A resist composition comprising (a) an imaging polymer, (b) a radiation sensitive acid generator, said imaging polymer comprising monomer units having a group pendant from a polymerizing portion of the monomer, the pendant group (PALM group) containing plural acid labile moieties, wherein said imaging polymer contains at least about 20 mole % of PALM-containing monomeric units, and (c) a bulky hydrophobic additive which is substantially transparent to 193 nm radiation.

23. A resist composition comprising (a) an imaging polymer, and (b) a radiation sensitive acid generator, said imaging polymer comprising monomer units having a group pendant from a polymerizing portion of the monomer, the pendant group (PALM group) containing plural acid labile moieties, wherein said imaging polymer contains at least about 20 mole % of PALM-containing monomeric units.

* * * * *